United States Patent
Sutterlin et al.

[11] Patent Number: 5,471,209
[45] Date of Patent: Nov. 28, 1995

[54] SIGMA-DELTA CONVERTER HAVING A DIGITAL LOGIC GATE CORE

[75] Inventors: Philip H. Sutterlin, San Jose; Walter J. Downey, Los Gatos, both of Calif.

[73] Assignee: Echelon Corporation, Palo Alto, Calif.

[21] Appl. No.: 205,704

[22] Filed: Mar. 3, 1994

[51] Int. Cl.⁶ ................................................. H03M 3/02
[52] U.S. Cl. ........................................ 341/143; 375/245
[58] Field of Search ................................. 341/143, 155; 375/25–34

[56] References Cited

U.S. PATENT DOCUMENTS

| | | | |
|---|---|---|---|
| 5,027,120 | 6/1991 | Thurston | 341/143 |
| 5,073,777 | 12/1991 | Fukuhara et al. | 341/131 |
| 5,196,852 | 3/1993 | Galton | 341/143 |
| 5,208,594 | 5/1993 | Yamazaki | 341/143 |
| 5,241,310 | 8/1993 | Tiemann | 341/143 |

*Primary Examiner*—Marc S. Hoff
*Attorney, Agent, or Firm*—Blakely, Sokoloff, Taylor & Zafman

[57] ABSTRACT

A sigma-delta A/D converter having a digital logic gate core. The converter is comprised of a loop filter for shaping the converter's quantization noise spectrum. The loop filter is comprised of an unbuffered CMOS logic gate inverter which can be implemented by a gate array. A quantizer is coupled to the loop filter. A logic gate buffer is configured as a one-bit comparator, which is used to perform the quantization. This logic gate buffer can be one of the gates of a gate array. A sampler is coupled to the quantizer for sampling the quantized signal. This sampler can also be implemented by digital circuitry of a gate array. The signal from the sampler is fed into a decimator. The decimator outputs a digital signal representative of the amplitude of the analog signal.

23 Claims, 8 Drawing Sheets

SIGMA-DELTA CONVERTER HAVING A DIGITAL LOGIC GATE CORE

FIELD OF THE INVENTION

The present invention pertains to the field of analog-to-digital (A/D) converters. More particularly, the present invention relates to a sigma-delta A/D converter having a core comprised of digital logic gates.

BACKGROUND OF THE INVENTION

In signal processing, it is often necessary to convert an analog signal to a digital representation which is proportional to the amplitude of the original analog signal and vice versa. This A/D conversion process is essential to any application in which a computer or other digital processor is controlling or monitoring processes, experiments, or whenever digital techniques are applied to traditionally "analog" jobs. For example, A/D converters are increasingly being used in a wide variety of applications ranging from audio and video processing to measurement instrumentation, medical diagnostics, etc. Furthermore, applications in which digital information is converted to an intermediate analog form for transmission or storage (e.g., various digital modems) require A/D converters to convert these intermediate analog signals back to a digital format. In short, A/D converters can be used in a host of different applications.

FIG. 1 shows a block diagram of a typical prior art A/D converter. An analog source 101 is filtered by an anti-aliasing filter 102 to ensure that the signal to be sampled, does not include significant energy above half the sample rate where such signals would otherwise produce in-band interference due to aliasing effects. Next, sampler 103 samples the filtered analog signal. In other words, sampler 103 discretizes the time scale. Provided that the sampling clock rate $f_s$ is more than twice the bandwidth of the analog signal (i.e., the Nyquist frequency), the original analog signal may be reconstructed without loss of information. Finally, the quantizer 104 converts the continuous amplitude sampled signal to a discrete set of values, which are output as a digital sequence.

Prior art A/D converters generally require a number of expensive and complex high-precision devices. For example, the anti-aliasing filter 102 would ideally have a flat magnitude response over the entire desired:d signal band while attenuating those frequencies above the Nyquist frequency to a level below the systems dynamic range floor. Thus, a high performance anti-aliasing filter is required to obtain high resolution with minimal distortion. In addition, the sampler 103 must accurately acquire values and hold them with minimal drift, providing enough time for the converter to compare the sampled analog signal to a set of reference levels. Thus, a high performance n-bit converter requires a sampler with better than one part in $2^n$ accuracy. Similarly the quantizer must determine which of $2^n$ possible reference values is closest to the sampled input. This implies a set of reference signals with better than one part in $2^n$ accuracy. In addition one or more comparators with offset errors below one part in $2^n$ of full scale are required. To illustrate these challenges a 12-bit A/D converter with an input range of 2 V should accurately resolve 500 μV differences in its input signal. Thus the total sampler acquisition and holding error, plus the error in reference values, plus the comparison error must be less then 500 μV. It is rather difficult and costly to achieve this degree of accuracy.

In an effort to overcome these problems, oversampled A/D converters were developed. Sigma-delta oversampled A/D converters are an outgrowth and extension of delta modulation techniques. Delta modulators quantize the sample to sample change in the input signal, rather than the absolute value of that signal. FIG. 2A shows a block diagram of a typical prior art delta modulator and its corresponding waveforms. The analog signal is summed by summer 201 with a negative feedback signal from the integrator 202. Essentially, the integrator 202 tries to predict the input analog signal x(t). The current prediction error term, x(t)–$\bar{x}$(t) is then quantized by a one-bit quantizer 203 to make the next prediction. FIG. 2B shows a block diagram of a typical delta demodulator and its corresponding output waveform. It can be seen that the received signal is integrated by integrator 204 and then smoothed by a low pass filter 205.

By taking advantage of delta modulation principles, sigma-delta A/D converters can utilize a low cost, low resolution one-bit quantizer. Furthermore, high resolution can be achieved by implementing a very high over-sampling rate (i.e., sampling at a rate tens of times faster than the Nyquist rate) and then down converting from that high sampling rate through a decimation process. In this way, the large quantization error of the one bit quantizer is spread over a wider frequency range thus reducing the error in the desired band. Moreover, various degrees of noise shaping can be implemented to further reduce the in-band error.

Although sigma-delta AID converters offer some advantages over conventional "Nyquist" A/D converters, sigma-delta converters, nonetheless, suffer from several drawbacks. One of these drawbacks pertains to the one-bit quantizer, which usually takes the form of a comparator. Inexpensive comparators typically have too much delay time, which could result in stability problems for the sigma-delta loop (since delay is equivalent to a phase shift which increases with increasing frequency). On the other hand, comparators fast enough to have a benign delay are prohibitively expensive.

Another disadvantage is flue to the fact that the integrator(s) are frequently fabricated using switched capacitor circuit techniques. These techniques typically require a mixed analog and digital integrated circuit (IC) process. Use of a mixed analog and digital IC process has several drawbacks as compared to the use of a pure digital process.

A primary disadvantage to the use of a mixed analog-digital IC process is that mixed signal IC processes and libraries typically lag digital IC processes and ASIC libraries by one generation or 12 to 16 months. Thus, at any point in time, an all digital implementation is lower cost by one process generation.

A second disadvantage of a mixed analog-digital IC process is that it takes significantly longer to bring an IC (or product employing that IC) to market. A primary reason that customized digital ICs can be fabricated more quickly is that IC vendors stock digital gate arrays which have many of the processing steps already applied. Thus, all that is required to complete the IC fabrication process is application of custom interconnections. Other reasons that digital IC fabrication is quicker than mixed fabrication include reduced layout time, reduced test generation and debug time and a much higher probability of first time success. In many cases, time to market is of critical importance to the success of a new product and in all these cases an IC architecture which utilizes all digital components has a significant advantage.

A third drawback to the requirement for a mixed analog-digital IC process is that digital IC process dimensions are continually being reduced in order to reduce production costs. It requires significantly less time and money to translate an all digital design to a smaller geolmetry process than it does to translate a mixed analog digital design. Thus, a product with an all digital IC architecture can be more readily cost reduced thereby extending its profitabire life.

A fourth disadvantage of mixed analog-digital IC architectures is the sensitivity of analog structures to temperature variation. For example, it is extremely difficult to make a switched capacitor integrator function well from −40° C. to +85° C. In summary a product architecture which maximizes digital gate content can be brought to market more quickly, provide for future cost reductions and enable wide temperature range functionality.

Thus, there is a need in the prior art for a high resolution sigma-delta A/D converter with an architecture having an all-digital core and minimal analog components. It would be preferable if the comparator and loop filter (e.g., integrator) of such an architecture could be implemented using the digital logic cells of a gate array. It would be of further advantage if these digital components could be employed in such a way that the converters performance was better than if digital gates were not used.

SUMMARY OF THE INVENTION

The present invention pertains to a sigma-delta A/D converter having a digital logic gate core. The converter is comprised of a loop filter, a quantizer, a sampler, and a decimator.

In the currently preferred embodiment, the loop filter is comprised of an integrator which is used to integrate the difference between the input analog signal and the sampler's output. The integrator is comprised of an unbuffered logic gate inverter. The library of gates available on a digital gate array semiconductor generally include unbuffered inverters. These single stage logic gates are provided for use in crystal oscillator circuits. Instead however, of using one of these unbuffered CMOS inverters as a clock oscillator, it is used in conjunction with an RC circuit as an integrator.

A quantizer is coupled to the integrator. In the present invention, a common logic gate buffer is configured as a one-bit comparator. This type of logic gate is used to perform magnitude quantization. In this way, the quantizer becomes just one of the thousands of gates of the gate array. A sampler is coupled to the quantizer for sampling the quantized signal. This sampler can also be implemented by digital circuitry of the gate array. The signal from the sampler is fed into a decimator. The decimator outputs a digital sequence representative of the analog input signal.

In the currently preferred embodiment, a second order sigma-delta A/D converter is implemented to achieve lower levels of in-band noise than provided by a first order converter. Furthermore, a digital high pass filter can be coupled to the converter for filtering out any offsets introduced by the integrator or comparator, if so required. In addition, an emitter follower bipolar transistor can be coupled to the output of the inverter for enhanced loop stability. Further stability can be achieved by adding a zero functioning in conjunction with the two poles of the second order converter. Moreover, the linearity of the converter can be optimized when converting low level signals by injecting a second, higher level signal at an out-of-band frequency and subsequently filtering out this injected high level signal. The converter's performance can further be improved by coupling an RC roll off circuit to the sampler for rounding off the high speed edge of the sampler's digital output prior to feeding it back around the sigma-delta feedback loop.

For narrow band applications, a pair of complex poles can be incorporated into the loop filter to provide a further improvement in performance. As will be shown, a sigma-delta converter's quantization noise spectrum is lowest at frequencies where its loop gain is the greatest. Thus, a pair of complex poles can be placed to produce a peak in the loop transfer function in the narrow band of interest. Thereby, greater noise rejection for that narrow band is achieved without attendant instabilities of higher order loop filters.

BRIEF DESCRIPTION OF THE DRAWINGS

The present invention is illustrated by way of example, and not by way of limitation, in the figures of the accompanying drawings and in which like reference numerals refer to similar elements and in which.

DETAILED DESCRIPTION

A sigma-delta A/D converter having a core comprised of digital logic components is described. In the following description, for purposes of explanation, numerous specific details are set forth, such as voltages, components, gain, phases, delays, etc., in order to provide a thorough understanding of the present invention. It will be obvious, however, to one skilled in the art that the present invention may be practiced without these specific details. In other instances, well-known structures and devices are shown in block diagram form in order to avoid unnecessarily obscuring the present invention.

Figure 1:
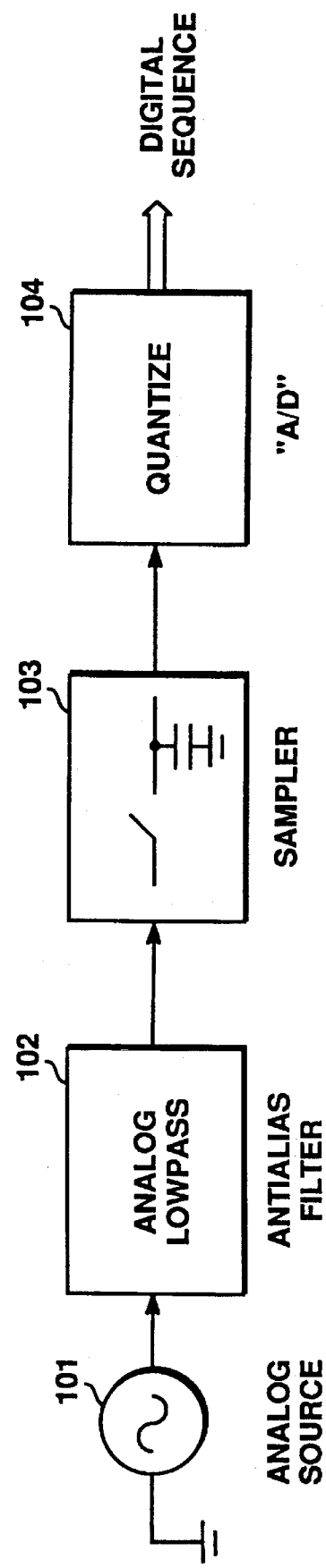
FIG. 1 shows a block diagram of a typical conventional prior art A/D converter.
Figure 2A:
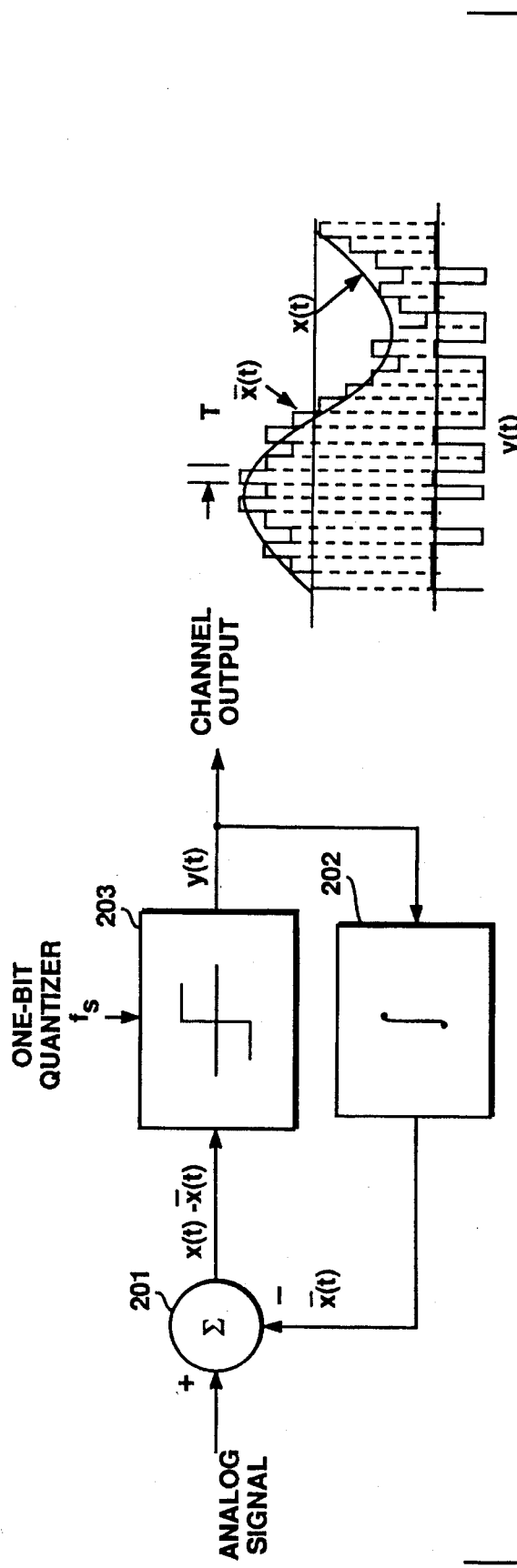
FIG. 2A shows a block diagram of a typical prior art delta modulator and its corresponding waveforms.
Figure 2B:
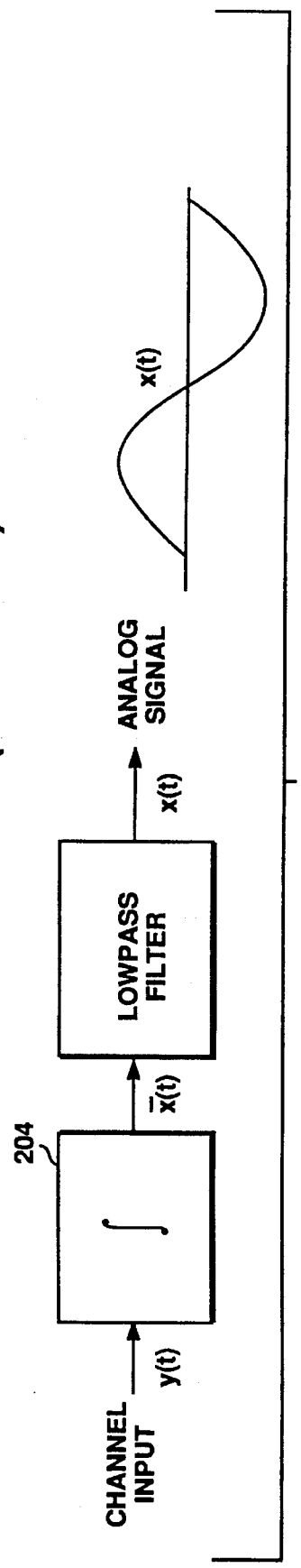
FIG. 2B shows a block diagram of a typical delta demodulator and its corresponding output waveform.
Figure 3:
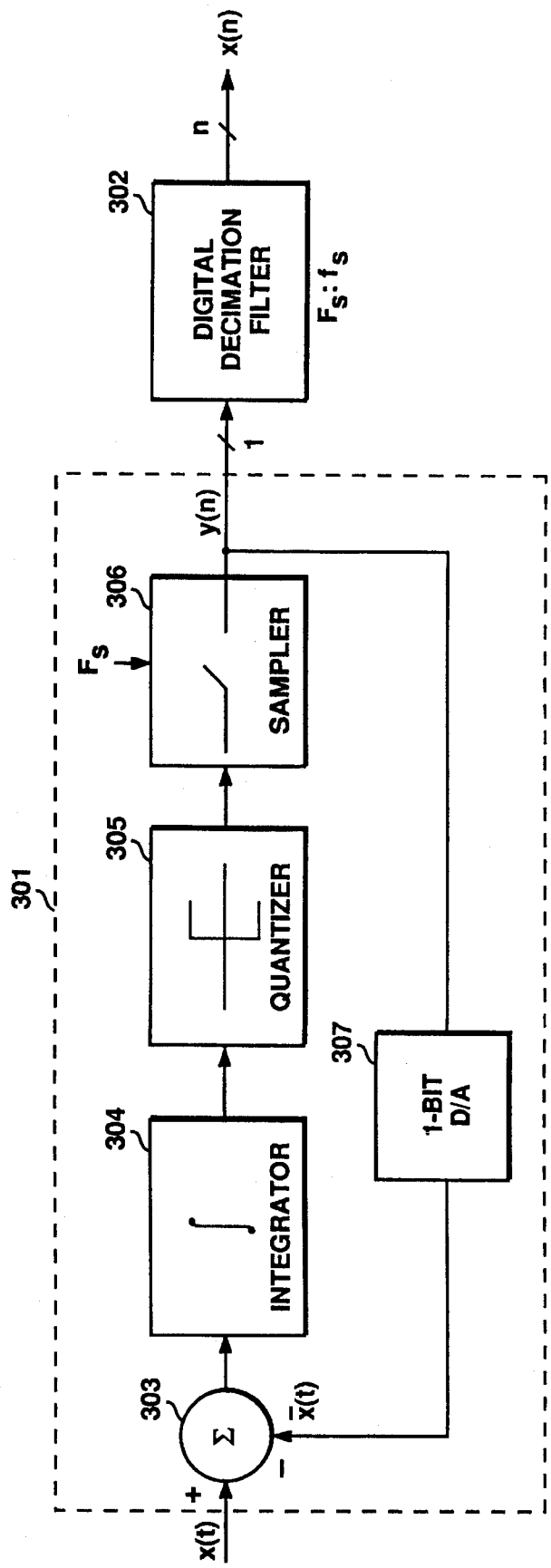
FIG. 3 shows the block diagram of a first-order over sampled sigma-delta A/D converter upon which the present invention may be implemented.

FIG. 3 shows the block diagram of a first-order over sampled sigma-delta A/D converter upon which the present invention may be implemented. The converter is comprised of a first order sigma delta modulator 301 followed by a digital decimation filter 302. The term "first order" refers to the single integrator roll off in the sigma-delta loop. The one-bit digital signal output from the first order sigma-delta modulator 301 is supplied to the digital decimation filter 302, which translates the oversampled sequence y(n) into a digital sequence x(n) with a lower sampling rate ($f_s$) and increased magnitude resolution.

The first-order sigma-delta modulator 301 is comprised of an analog difference summer 303, a loop filter 304 (e.g., an integrator), a one-bit quantizer 305, sampler 306, and a one-bit D/A converter 307 in a feed back structure. The analog signal x(t) is input to summer 303. Summer 303 takes the difference between the input signal x(t) and the quantized output value y(n) converted back to the predicted analog signal $\bar{x}$(t), which is then fed into loop filter 304. The output signal from loop filter 304 is then quantized by quantizer 305 and oversampled at the frequency $f_s$ to produce the output signal y(n). This output signal y(n) from the modulator 301 is a single bit wide binary sequence.

Note that the difference between the input signal x(t) and the fed back signal $\bar{x}$(t) at the loop filter input is approximately equal to the quantization error. This error is converted by loop filter 304 and then quantized. Although the quantization error at every sampling instance is large due to the coarse nature of the quantizer 305, the modulator loop generates a bi-level output which is averaged over several input sample periods to increase magnitude precision. The averaging is performed by the decimation filter 302 which follows modulator 301.

Figure 4:
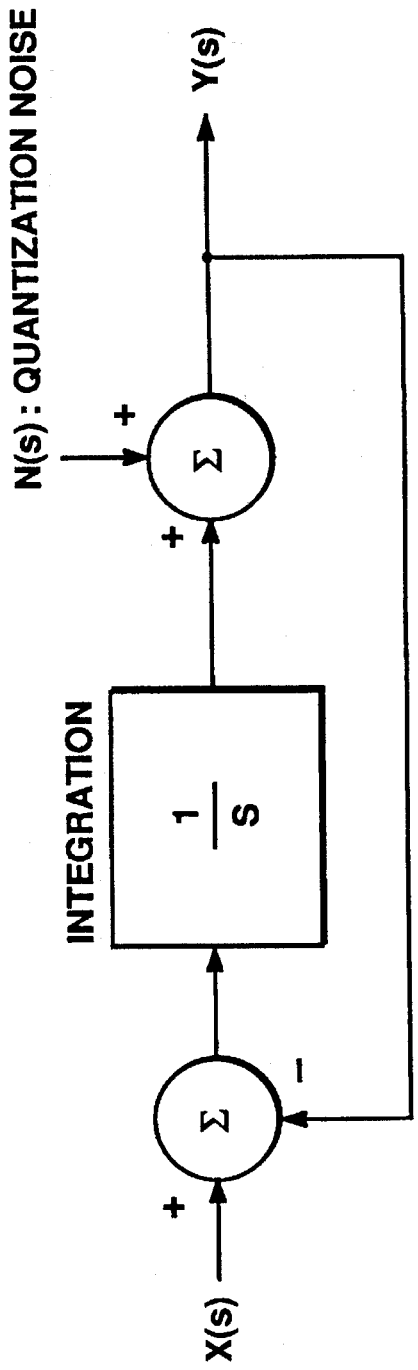
FIG. 4 shows a simplified block diagram of the sigma-delta modulator in the S-domain.

FIG. 4 shows the block diagram of the sigma-delta modulator in the S-domain. Applying standard circuit analysis to this block diagram yields a signal transfer function (when N(s)=0) of:

$$Y(s) = [X(s) - Y(s)] \frac{1}{s}$$

$$\frac{Y(s)}{X(s)} = \frac{\frac{1}{s}}{1 + \frac{1}{s}} = \frac{1}{s+1}$$

and a noise transfer function(when X(s)=0) of:

$$Y(s) = -Y(s) \frac{1}{s} + N(s)$$

$$\frac{Y(s)}{N(s)} = \frac{1}{1 + \frac{1}{s}} = \frac{s}{s+1}$$

It can be seen from these transfer functions that the more open loop gain at the signal frequencies of interest, the greater the reduction in noise at those frequencies.

However, in optimizing the open loop gain at these signal frequencies, one must keep the loop from oscillating. In order to keep the loop stable, it is desirable to maintain a phase margin of approximately 45 degrees, or more. This criteria limits the amount of open loop gain that can practically be implemented. Less open loop gain translates into less reduction in the quantization noise error (i.e., lower performance). More gain raises the unity loop gain crossover frequency such that unintended parasitic poles will degrade phase margin. In addition, extra delays in the loop add to the phase shift, which means that the open loop gain must be reduced further to ensure stability. Thus a reduction in loop delay enables higher performance.

One potentially significant source of delay is in the comparator which is used as the one-bit quantizer of the sigma-delta A/D converter. By way of example, consider the phase shift added to the loop by a 200 nS comparator (such as the industry standard LM311). At 2 MHz 200 nS of delay equates to 144° of phase lag. Since the sigma-delta integrator introduces an additional 90° phase lag we see that a 2 MHz unity gain crossover frequency would result in −54° of phase margin (even before accounting for any delay in the sampler). Thus the use of a comparator with a 200 nS response time would require a reduction in loop gain and unity gain crossover frequency for stable operation.

In more general terms, it can be seen that a 45° phase margin results when the total phase lag at the unity crossover frequency is 135°. As an approximate guide one could consider allocating 90° of lag to the loop filtering function (an integrator in the case of a first order loop) leaving 45° of lag for loop delays. The approximate maximum achievable unity gain crossover frequency ($f_{u_{max}}$) is then given by:

$$f_{u_{max}} \approx \frac{45}{360} \cdot \frac{1}{t_d} = \frac{1}{8t_d}$$

where $t_d$ is the total loop delay.

Knowing that there is a direct relationship between unity gain crossover frequency and loop gain (for a given loop filter function), we see that minimizing loop delay is key to achieving maximum sigma-delta converter performance. Considering that the sampler introduces an average delay equal to one half the sample period $$\left( \frac{1}{2F_s} \right)$$

maximum performance is achieved when the quantizer's delay becomes insignificant relative to.

$$\left( \frac{1}{2F_s} \right).$$

Figure 5:
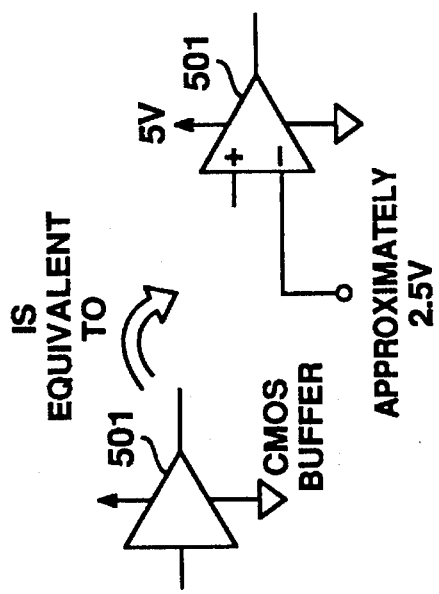
FIG. 5 shows a circuit equivalence for digital CMOS buffer used as a comparator in the currently preferred embodiment.

In the currently preferred embodiment $F_s$=10 MHz. Performance would therefore be maximized if a comparator with significantly less than 50 nS (i.e., ~5 nS) were employed as a quantizer. Commercially available comparators with less than 10 nS of delay typically cost as much as an entire multi-thousand gate array. Thus, the present invention utilizes a logic gate CMOS buffer as a high speed comparator for performing the one-bit quantization. In the currently preferred embodiment, a digital CMOS buffer implemented in a 0.8 micron CMOS geometry process, shown as 501 of FIG. 5, is used as a comparator. The logic gate CMOS buffer 501 is equivalent to a very fast (~1 nS) comparator that is triggered at approximately half of its supply voltage. In other words, the transfer function of logic gate CMOS buffer 501 is such that a 0 volt input signal results in a 0 volt output signal; a 5 volt input signal results in a 5 volt output signal; and as the input signal ramps up from 0 to 5 volts, the output signal switches from 0 to 5 volts when the input voltage approaches approximately 2.5 volts (e.g., anywhere in the range from 2.0 to 3.0 volts). Thus using a standard CMOS logic ;ate as a quantizer results in a higher level of sigma-delta converter performance than would be achieved with traditional comparator circuits. Furthermore, this CMOS buffer 501 can be implemented as one of the thousands of gates that are available on a gate array or programmable logic device.

And although the CMOS buffer 501 can have a relatively large input off,et (e.g., approximately 1.0 volt), its contribution to the sigma-delta converters output offset is reduced by the DC gain preceding it in the loop (i.e., the DC gain of the integrator in the topology of FIG. 3). Moreover, in some instances, having a relatively large offset is not critical (e.g., conversion signals which have been carrier modulated). Furthermore, the offset at the output of the sigma-delta converter can be eliminated, if necessary, by a digital high pass filter coupled after the sigma-delta A/D converter (essentially providing the equivalent of AC coupling). Thus, the use of a logic gate as a quantizer optimizes both cost and performance.

Figure 6A:
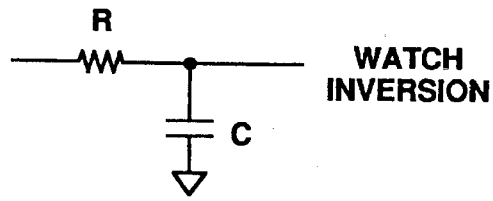
FIG. 6A shows one embodiment where the integrator of the sigma-delta A/D converter is comprised of an RC (resistor/capacitor) network.
Figure 6B:
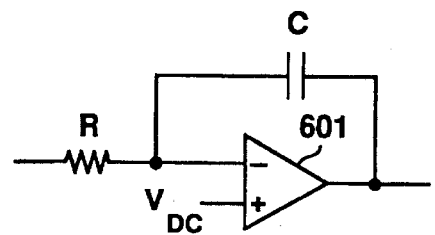
FIG. 6B shows an alternative embodiment where the integrator is comprised of an operational amplifier (op-amp).

In one embodiment, the loop filter of the sigma-delta A/D converter is comprised of an integrator which is approximated by an RC (resistor/capacitor) network, as shown in FIG. 6A. Such an RC network has 0 dB gain at a DC, introduces no offset of its own, and is very low cost. In al alternative embodiment, the integrator is comprised of an operational amplifier (op-amp) 601, as shown in FIG. 6B. This op-amp integrator has lots of DC gain (e.g., 80 dB), minimal offset (e.g., 5 millivolts), but requires either a mixed analog/digital IC process or the use of a separate active circuit. Note that the use of inverting integrators require that the difference summer of the sigma-delta converter be replaced with an additive summer in order to maintain negative feedback.

Figure 6C:
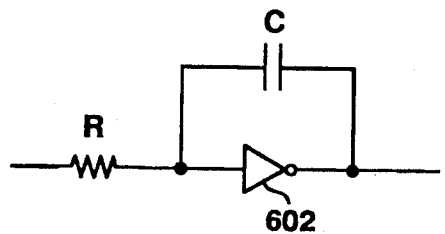
FIG. 6C shows in the currently preferred embodiment that the integrator is comprised of an unbuffered CMOS inverter.

In the currently preferred embodiment, the integrator is comprised of an unbuffered logic gate CMOS inverter 602, as shown in FIG. 6C. It should be noted that buffered inverters are impractical for use as integrators because they have too much phase shift attributed to their extra transistor gain stages. Unbuffered logic gate CMOS inverter 602 can be found in most digital gate arrays, as they are supplied for use in clock oscillator circuits. In the present invention, one of these same unbuffered logic gate CMOS inverters is coupled to a resistor and capacitor as shown in FIG. 6C to produce an inverting integrator. An unbuffered logic gate CMOS inverter used in this manner has an approximate DC gain of 30 dB, an offset uncertainty of about 0.5 volts, and is very low cost since the unbuffered CMOS inverter can be one of the thousands of logic gates of a digital gate array. As described above, the relatively large offset is not critical.

Figure 6D:
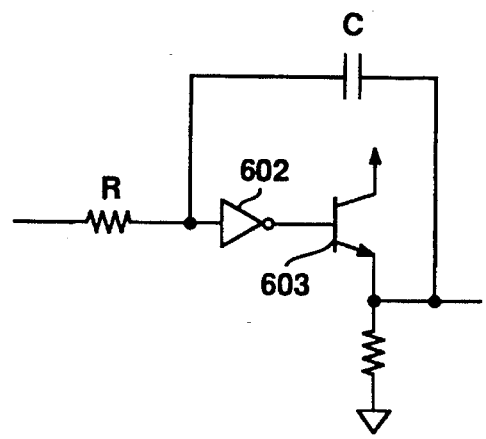
FIG. 6D shows that a single bipolar transistor can be coupled to an inverter as an emitter follower, in order to minimize the integrators output impederace thereby improving loop stability.

However, the output impedance of a typical unbuffered gate used in this way is relatively large (e.g., 1 Kohm) and is a function of the size of the transistors. A single bipolar transistor 603 can be coupled to inverter 602 as an emitter follower, as shown in FIG. 6D. This avoids the detrimental unstabilizing effects of a right half plane zero in the integrator's transfer function. The occurrence of right half plane zeros and their detrimental effect on feedback loop stability is well documented in texts covering operational amplifier design. The emitter follower transistor 603 reduces the output impedance of the integrator by its current gain, beta. Given a beta value of 100, the output impedance of the integrator becomes 10 ohms.

Figure 7:
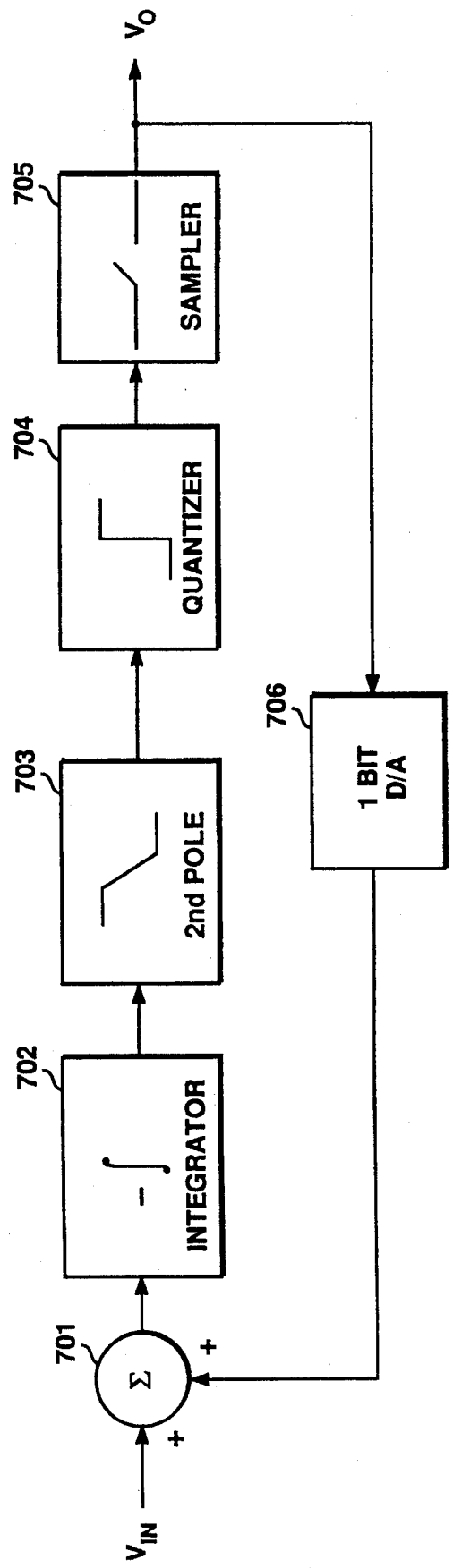
FIG. 7 shows a block diagram of a second order sigma-delta modulator.

It is known that higher order modulators have less baseband noise because the noise is shaped concentrating more of it at higher frequencies. However, higher order modulators are more difficult to stabilize due to the additional phase shift produced by the extra poles. In the currently preferred embodiment, a second order sigma-delta modulator is utilized. FIG. 7 shows a block diagram of a second order sigma-delta modulator. The modulator is comprised of a summer 701, an inverting integrator 702, a circuit 703 for generating a second pole for producing the second order, a quantizer 704, a sampler 705, and one bit D/A converter 706.

Figure 8:
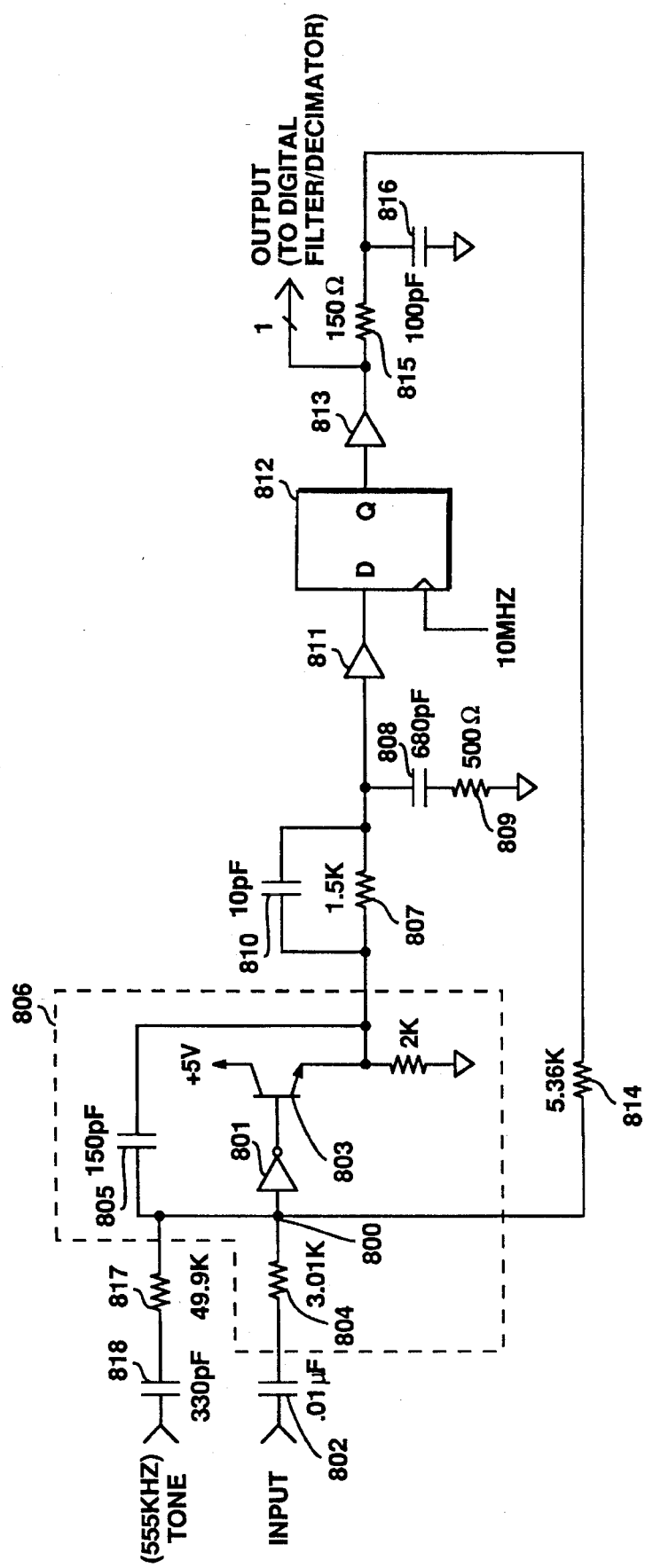
FIG. 8 shows a detailed circuit diagram of the currently preferred embodiment of the sigma-delta A/D converter of the present invention.

FIG. 8 shows a detailed circuit diagram of the currently preferred embodiment of the sigma-delta A/D converter of the present invention. The analog signal is input to summing node 800 through resistor 804. The summing node 800 is connected to the input of the unbuffered inverter 801. Capacitor 802 is used to provide AC coupling to block incoming DC components. The emitter follower transistor 803 is coupled to the output of the unbuffered inverter 801. Transistor 803 can be a bipolar transistor part number 2N3906. The combination of the unbuffered inverter 801, emitter follower transistor 803, resistor 804, and capacitor 805 comprise the integrator 806.

A first pole exists in the integrator 806. In addition, a second pole is inserted into the loop by implementing resistor 807 and capacitor 808. In order to keep the loop stable, a zero is inserted at an appropriate location to ensure that the two poles do not result in an excessive phase shift. This zero is effectuated by resistor 809. Capacitor 810 is used to compensate for the input capacitance of buffer 811. Buffer 811 is connected to function as a comparator as described above thus performing the one-bit quantization. The output from buffer 811 is coupled to a flip-flop 812. Flip-flop 812 comprises the sampler. In the currently preferred embodiment, a sampling rate $F_s$ of 10 MHz is used. The signal from flip-flop 812 is driven by buffer 813 and output to the digital filter/decimator. Lastly, resistor 814 functions as 1 bit D/A converter converting the sigma-delta output back to analog form for summing with the input at summing node 800. The feedback loop is negative due to the unbuffered inverter 801 of integrator 806. Note that the unbuffered inverter 801, CMOS buffer/comparator 811, flip-flop/sampler 812, and driver 813 components can all be fabricated out of standard digital gate array logic cells. Furthermore, these gate array cells can be part of a larger device (e.g., a modem, transceiver, instrument, processor, etc.).

In the currently preferred embodiment, two enhancements were added to further improve performance. First an additional signal is injected into the sigma-delta A/D converter. This injected signal is used to improve the converter's linearity when converting low level input signals. The injected signal is at a relatively high level (e.g., 15 dB below the converter's full scale) and is at a frequency That falls outside the band of interest. It has been shown that injecting a higher level out-of-band signal improves the linearity in converting low level in-band signals. Subsequently, the injected signal is filtered out. In the currently preferred embodiment, a 555 kHz, 5 volt peak-to-peak, squarewave tone is injected into the sigma-delta A/D converter through resistor 817 and capacitor 818. Other signals performing this function of spectral redistribution may also be used. The second improvement consists of resistor 815 and capacitor 816 which were added to "round off" the high speed edge of the output digital waveform. The values of resistor 815 an capacitor 816 are chosen so that it results in a slight high frequency roll-off without causing too much phase shift in the loop. It should be noted that the present invention may be practiced without utilizing either of these two enhancements.

In an alternative embodiment, a pair of complex poles can be incorporated in the converter's loop filter. Rather than using an integrator to perform the loop filter function as described above, a filter having a transfer function that produces a peak in the open loop gain for a critical frequency range of interest is implemented. This embodiment is preferable for narrow-band conversion applications because the higher the loop gain, the lower the noise becomes at that frequency. This embodiment could also be used for conversion of wide band signals by shaping the quantization noise spectrum to produce a preferred result. For example, in audio applications, the complex pole pair could be placed near 2 kHz where the human ear is most sensitive to noise.

Figure 9:
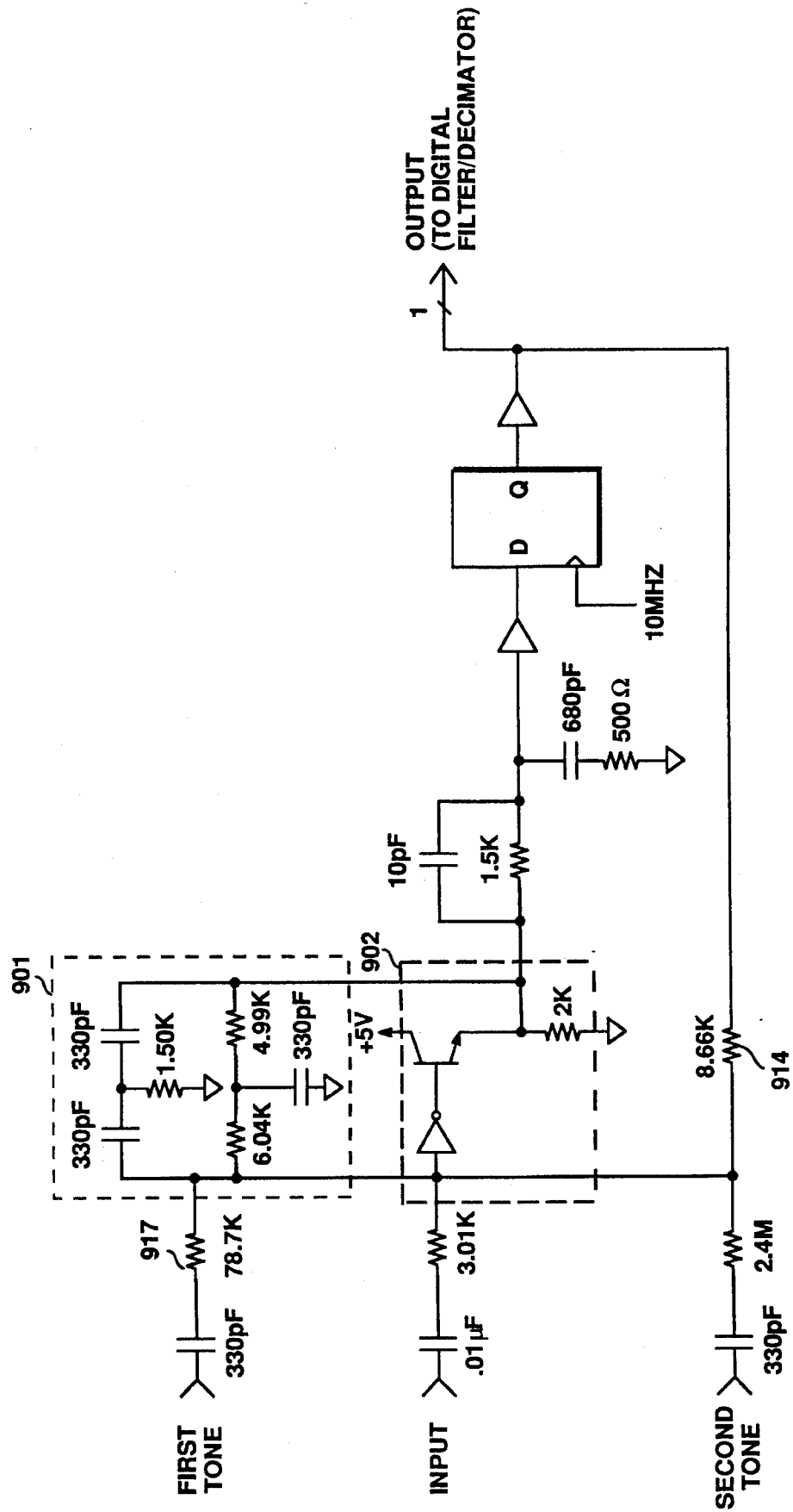
FIG. 9 shows a detailed circuit diagram for a narrow band sigma-delta A/D converter.

FIG. 9 shows a circuit diagram of the embodiment that is preferred for narrow-band applications. The integrating capacitor (i.e., capacitor 805 of FIG. 8) is replaced with a twin-T network 901. Standing alone, the twin-T network 901 acts as a band-stop filter. However, placing the twin-T network 901 in the feedback path of inverting amplifier 902 results in a pair of complex poles. The twin-T network 901, in conjunction with inverting amplifier 902, has a flat response at DC and the lower frequencies, peaks at the frequency of interest, and rolls off at the rate of 6 dB/octave at higher frequencies. The phase characteristic of this 6 dB/octave high frequency slope (for frequencies substantially above the peaking frequency) is a constant 90 degree phase lag. This being the same phase characteristic as that of the integrator it is no more difficult to achieve loop stability with this approach. The values shown in FIG. 9 for the resistors and capacitors of twin-T network 901 are for conversion of a narrow band signal having a center frequency of approximately 131.5 kHz and 5.5 kHz bandwidth. Note that, a second pseudo-random tone is input at a level which spreads the spectrum of any noise peaks (i.e., idling tones or "birdies") without affect to the in-band performance.

Thus, a sigma-delta A/D converter having a core comprised of digital logic gates is described.

What is claimed is:

1. An analog to digital converter circuit comprising:

an integrator for integrating an analog input signal to produce an integrated signal, wherein said integrator is comprised of a logic gate inverter;

a quantizer coupled to said integrator for quantizing said integrated signal to produce a quantized signal;

a sampler coupled to said quantizer for sampling said quantized signal;

a decimator coupled to said sampler for decimating a sampled signal from said sampler, said decimator outputting a digital signal representative of an amplitude of said analog signal.

2. The analog to digital converter circuit of claim 1, wherein said inverter is comprised of an unbuffered CMOS inverter of a gate array.

3. The analog to digital converter circuit of claim 2 further comprising an emitter follower bipolar transistor coupled to the output of said logic gate inverter.

4. The analog to digital converter circuit of claim 1, wherein said quantizer is comprised of a one-bit comparator that is implemented by a logic gate buffer.

5. The analog to digital converter circuit of claim 4 further comprising a high pass filter for filtering out an offset of said converter.

6. The analog to digital converter circuit of claim 1 further comprising a means for providing a second pole for making said converter into a second order converter.

7. The analog to digital converter circuit of claim 6 further comprising a means for providing a zero for ensuring that said second order converter remains stable.

8. The analog to digital converter circuit of claim 1 further comprising:

a means for injecting a high level signal to said converter, wherein said high level signal is out of the band of interest;

means for filtering out said high level signal, wherein the linearity of said converter is optimized.

9. The analog to digital converter circuit of claim 1 further comprising a capacitor logically coupled between said integrator and said quantizer for compensating an input capacitance associated with said quantizer.

10. The analog to digital converter circuit of claim 1 further comprising a round off circuit coupled to said sampler for rounding off an edge of said digital signal.

11. A method for converting an analog signal to a digital signal representative of an amplitude of said analog signal, said method comprising the steps of:

providing a logic gate inverter of a gate array for integrating said analog signal to produce an integrated signal;

implementing a logic gate buffer of said gate array as a quantizer for quantizing said integrated signal into a quantized signal;

sampling said quantized signal to produce a sampled signal;

decimating said sampled signal to generate said digital signal.

12. The method of claim 11 further comprising the step of coupling an emitter follower bipolar transistor to an output of said logic gate inverter.

13. The method of claim 11 further comprising the step of filtering out an offset associated with said quantizer.

14. The method of claim 11 further comprising the step of providing a second pole for implementing a second order converter.

15. The method of claim 14 further comprising the step of providing a zero for ensuring that said second order converter remains stable.

16. The method of claim 11 further comprising the steps of:

injecting a high level signal out of the band of interest to said converter;

filtering out said high level signal to optimize the linearity of said converter.

17. The method of claim 11 further comprising the step of compensating for an input capacitance associated with said quantizer.

18. An analog to digital converter circuit comprising:

an integrator for integrating an analog input signal to produce an integrated signal;

a quantizer coupled to said integrator for quantizing said integrated signal to produce a quantized signal, wherein said quantizer is comprised of a logic gate, wherein said logic gate is comprised of a digital logic buffer functioning as a comparator;

a sampler coupled to said quantizer for sampling said quantized signal; and a decimator coupled to said sampler for decimating a sampled signal from said sampler, said decimator outputting a digital signal representative of an amplitude of said analog signal.

19. The analog to digital converter circuit of claim 18, wherein said buffer is a digital logic CMOS buffer.

20. An analog to digital converter circuit comprising:

an integrator for integrating an analog input signal to produce an integrated signal;

a quantizer coupled to said integrator for quantizing said integrated signal to produce a quantized signal, wherein said quantizer is comprised of a logic gate;

a sampler coupled to said quantizer for sampling said quantized signal;

a decimator coupled to said sampler for decimating a sampled signal from said sampler, said decimator outputting a digital signal representative of an amplitude of said analog signal; and a high pass filter coupled to said decimator for filtering out an offset of said converter.

21. An analog to digital converter circuit comprising:

an integrator comprising an unbuffered CMOS inverter of a gate array for integrating an analog input signal to produce an integrated signal;

a quantizer coupled to said integrator for quantizing said integrated signal to produce a quantized signal, wherein said quantizer is comprised of a logic gate;

a sampler coupled to said quantizer for sampling said quantized signal; and a decimator coupled to said sampler for decimating a sampled signal from said sampler, said decimator outputting a digital signal representative of an amplitude of said analog signals.

22. The analog to digital converter circuit of claim 21, further comprising an emitter follower bipolar transistor coupled to an output of said inverter.

23. An oversampled A/D converter comprising:

a loop filter circuit having an open loop transfer function with a peak corresponding to a frequency wherein noise in a converted signal is minimized, wherein said transfer function is implemented by a logic gate;

a quantizer coupled to said loop filter circuit for quantizing said converted signal to produce a quantized signal;

a sampler coupled to said quantizer for sampling said quantized signal; and a decimator coupled to said sampler for decimating a sampled signal from said sampler, said decimator outputting a digital signal representative of an amplitude of said analog signal.

* * * * *

UNITED STATES PATENT AND TRADEMARK OFFICE
CERTIFICATE OF CORRECTION

PATENT NO. : 5,471,209        Page 1 of 2
DATED : November 28, 1995
INVENTOR(S) : Sutterlin et al.

It is certified that error appears in the above-identified patent and that said Letters Patent is hereby corrected as shown below:

In column 1 at line 46 delete "fiat" and insert --flat--

In column 1 at line 47 delete "desired:d" and insert --desired--

In column 2 at line 28 delete "AID" and insert --A/D--

In column 2 at line 39 delete "flue" and insert --due--

In column 3 at line 3 delete "geolmetry" and insert --geometry--

In column 3 at line 6 delete "profitabire" and insert --profitable--

In column 4 at line 44 delete "impederace" and insert --impedance--

In column 6 at line 66 delete ";ate" and insert --gate--

In column 7 at line 6 delete "off$_s$et" and insert --offset--

In column 7 at line 22 delete "al" and insert --an--

In column 8 at line 47 delete "That" and insert --that--

UNITED STATES PATENT AND TRADEMARK OFFICE
CERTIFICATE OF CORRECTION

PATENT NO. : 5,471,209
DATED : November 28, 1995
INVENTOR(S) : Sutterlin et al.

It is certified that error appears in the above-indentified patent and that said Letters Patent is hereby corrected as shown below:

Column 12, line 3, delete "signals" and insert —signal—

Signed and Sealed this

Tenth Day of September, 1996

BRUCE LEHMAN

Attest:

Attesting Officer

Commissioner of Patents and Trademarks